United States Patent
He et al.

(10) Patent No.: US 9,250,297 B2
(45) Date of Patent: Feb. 2, 2016

(54) METHODS FOR TESTING LITHIUM ION BATTERY AND EVALUATING SAFETY OF LITHIUM ION BATTERY

(71) Applicants: Xiang-Ming He, Beijing (CN); Jian-Jun Li, Beijing (CN); Li Wang, Beijing (CN); Jian Gao, Beijing (CN)

(72) Inventors: Xiang-Ming He, Beijing (CN); Jian-Jun Li, Beijing (CN); Li Wang, Beijing (CN); Jian Gao, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 554 days.

(21) Appl. No.: 13/675,028

(22) Filed: Nov. 13, 2012

(65) Prior Publication Data
US 2014/0077818 A1   Mar. 20, 2014

(30) Foreign Application Priority Data

Sep. 14, 2012   (CN) .......................... 2012 1 03400007

(51) Int. Cl.
*G01N 27/416*   (2006.01)
*G01R 31/36*   (2006.01)

(52) U.S. Cl.
CPC .................. *G01R 31/3627* (2013.01)

(58) Field of Classification Search
CPC ..................................... G01R 31/3627
USPC ......................................... 324/433
See application file for complete search history.

(56) References Cited

U.S. PATENT DOCUMENTS

| 2004/0234865 A1* | 11/2004 | Sato et al. | 429/322 |
| 2012/0171579 A1* | 7/2012 | Tsai et al. | 429/331 |

\* cited by examiner

*Primary Examiner* — Richard Isla Rodas
*Assistant Examiner* — David V Henze-Gongola
(74) *Attorney, Agent, or Firm* — Novak Druce Connolly Bove + Quigg LLP

(57) ABSTRACT

A method for testing a lithium ion battery is disclosed. An under-test lithium ion battery including a cathode active material is provided. A reference voltage value is set according to the cathode active material. The under-test lithium ion battery is over charged, while an actual voltage change of the under-test lithium ion battery is tested during the over charging. A maximum voltage value is recorded before a first decrease in the actual voltage change of the under-test lithium ion battery during the over charging. The maximum voltage value is compared with the reference voltage value. A method for evaluating a safety of a lithium ion battery is also disclosed.

13 Claims, 5 Drawing Sheets

METHODS FOR TESTING LITHIUM ION BATTERY AND EVALUATING SAFETY OF LITHIUM ION BATTERY

CROSS-REFERENCE TO RELATED APPLICATIONS

This application claims all benefits accruing under 35 U.S.C. §119 from China Patent Application No. 201210340000.7, filed on Sep. 14, 2012, in the China Intellectual Property Office, the disclosure of which is incorporated herein by reference.

BACKGROUND

1. Technical Field

The present disclosure relates to methods for testing lithium ion batteries and evaluating safety of lithium ion batteries.

2. Description of Related Art

Safety is a concern in utilizing lithium ion batteries in electric vehicles (EV) and hybrid electric vehicles (HEV). Accidents are generally due to an internal short circuit which causes thermal runaway of the lithium ion battery. One reason for the internal short circuit of the lithium ion battery is over charging of the lithium ion battery, which results in the lithium ion battery being charged to a high voltage beyond the charging cut-off voltage. Therefore, evaluating the safety of the lithium ion battery, especially evaluating the over charging endurance ability of the cathode electrode, is very important.

In related art, methods for evaluating the safety of the lithium ion battery consists of evaluating the amount of heat generated during the over charging process, and the occurring time and temperature of the thermal runaway of the lithium ion battery. However, the temperature of the thermal runaway of the lithium ion battery is affected by many factors such as a battery structural design and an environmental temperature. Results may be different when testing the temperature is done on an outside surface of a battery shell, an inside surface of a battery shell, a top portion of a battery shell, or a connecting member of the battery. Different heat dissipation speeds caused by different surrounding temperatures can also affect the temperature testing result of the lithium ion battery. Thus, the temperature data of different sizes, different structural designs, or different batches of lithium ion batteries cannot be compared. Therefore, the evaluation and investigation of the safety of the lithium ion battery may be difficult and inaccurate by testing the temperature of the lithium ion battery. The temperature data cannot truly reflect the over charging endurance ability of a cathode electrode of the lithium ion battery.

What is needed, therefore, is to provide a method for testing the lithium ion battery and a method for evaluating the safety of the lithium ion battery not affected by battery structural designs and environmental conditions, accurately reflect the over charging endurance ability, and accurately evaluate the safety of the lithium ion battery.

BRIEF DESCRIPTION OF THE DRAWINGS

Many aspects of the present disclosure can be better understood with reference to the following drawings. The components in the drawings are not necessarily to scale, the emphasis instead being placed upon clearly illustrating the principles of the present embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean at least one.

Figure 4:
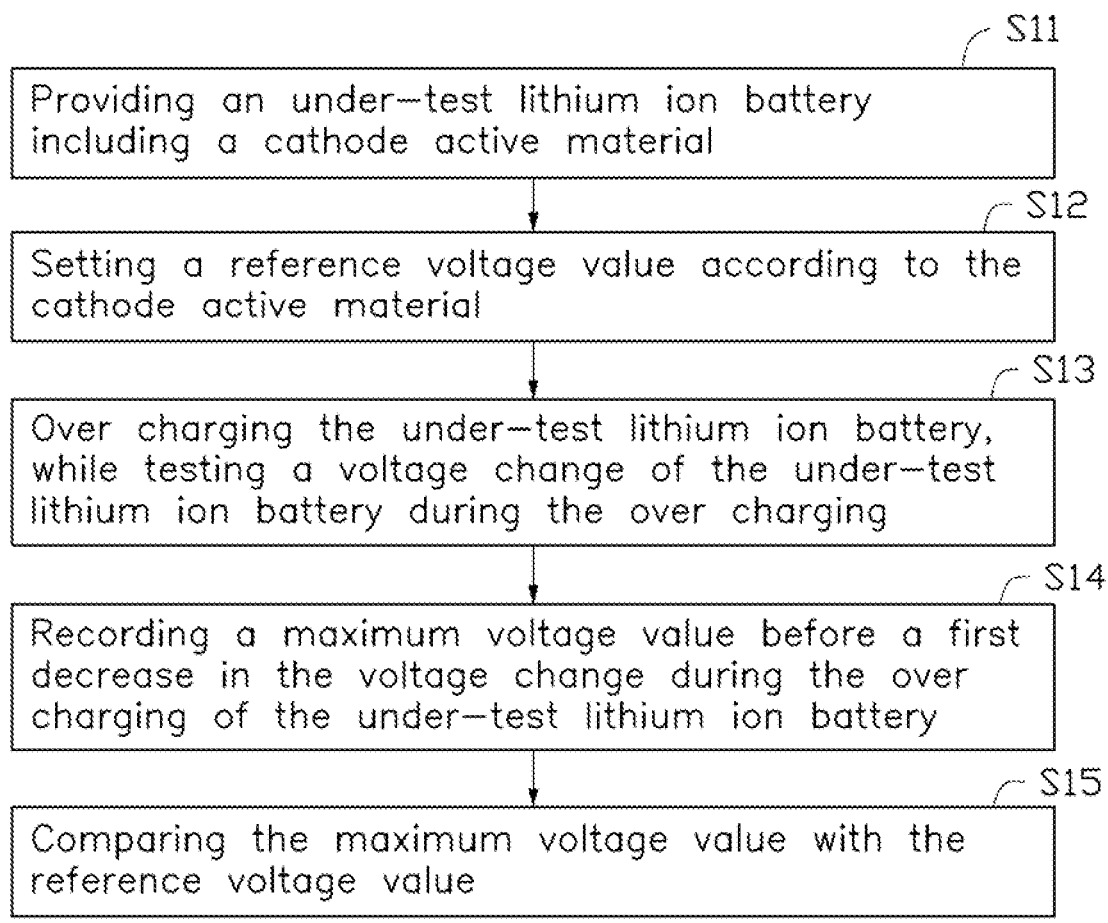
FIG. 4 shows a flow chart of one embodiment of a method for method for testing a lithium ion battery.

Referring to FIG. 4, one embodiment of a method for testing a lithium ion battery includes steps of:

S11, providing an under-test lithium ion battery including a cathode active material;

S12, setting a reference voltage value according to the cathode active material;

S13, over charging the under-test lithium ion battery, while testing a voltage change of the under-test lithium ion battery during the over charging;

S14, recording a maximum voltage value before a first decrease in the voltage change during the over charging of the under-test lithium ion battery; and S15, comparing the maximum voltage value with the reference voltage value.

The under-test lithium ion battery is the lithium ion battery that is to be tested to evaluate the safety thereof. The lithium ion battery includes a cathode electrode, an anode electrode, and an electrolyte disposed between the cathode electrode and the anode electrode. The electrolyte can be a solid or a liquid. The cathode electrode and the anode electrode are spaced from each other by a separator or by a solid electrolyte film. The cathode electrode can include a cathode current collector and a cathode material layer located on at least one surface of the cathode current collector. The cathode material layer includes a cathode active material, and can further include a conducting agent and a binder. The conducting agent and the binder are uniformly mixed with the cathode active material.

The cathode active material can have a reversible intercalation and deintercalation of lithium ions upon charging and discharging to have a battery capacity. Examples for the cathode active material are layer type lithium transition metal oxides (e.g., $LiCoO_2$, $LiNiO_2$, $LiMnO_2$), spinel type lithium transition metal oxides (e.g., $LiMn_2O_4$, $LiNiMnO_4$), and olivine type lithium transition metal phosphates (e.g., $LiFePO_4$, $LiCoPO_4$, $LiNiPO_4$).

In one embodiment, the cathode active material is coated with a coating layer on a surface thereof. The coating layer can be individually coated on single particles of the cathode active material. The coating layer can be an in situ formed layer on the surface of the cathode active material, and is a continuous material layer having a uniform thickness. For example, the coating layer is an in situ formed and continuous aluminum phosphate ($AlPO_4$) layer having a uniform thickness.

In step S12, the reference voltage value is set based on and changes with the material of the cathode active material. The reference voltage value can be a maximum voltage value before a first voltage decrease during an over charging of a reference lithium ion battery. The reference lithium ion battery and the under-test lithium ion battery can have different battery structural designs, sizes, and/or battery capacities. For example, the reference lithium ion battery and the under-test lithium ion battery can be a button type lithium ion battery, and the other, a coil type lithium ion battery. The cathode electrodes of the reference lithium ion battery and the under-test lithium ion battery only need to have the same material of the cathode active material, and can have different conducting agents, binders, and/or other coating or doping materials.

It is to be understood that, the reference voltage value is chosen for actual needs. That is, if a lithium ion battery is seen as having an acceptable safety, the lithium ion battery can be used as the reference lithium ion battery. The maximum voltage value of the reference lithium ion battery before the first voltage decrease during the over charging can be used as the reference voltage value, which is used as a criterion for evaluating the safety of the under-test lithium ion battery and the over charging endurance ability of a cathode electrode of the under-test lithium ion battery. In another embodiment, when comparing the safety or the over charging endurance ability of two lithium ion batteries, one can be set as the reference lithium ion battery, and the other can be set as the under-test lithium ion battery.

Figure 5:
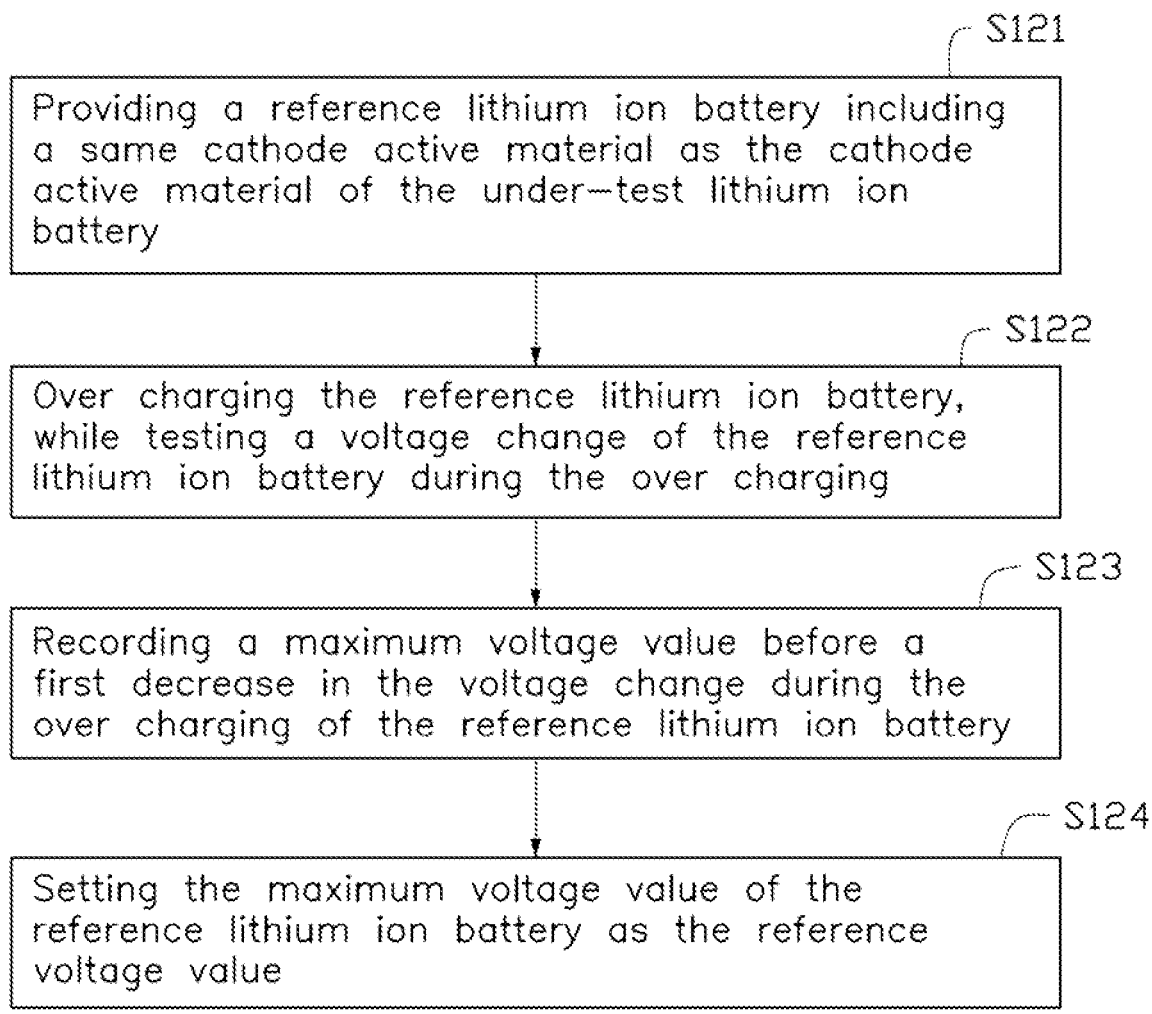
FIG. 5 shows a flow chart of one embodiment of a method for setting a reference voltage value.

Referring to FIG. 5 more specifically, the reference voltage value can be set by following steps:

S121, providing a reference lithium ion battery including a same cathode active material as the cathode active material of the under-test lithium ion battery;

S122, over charging the reference lithium ion battery, while testing a voltage change of the reference lithium ion battery during the over charging;

S123, recording a maximum voltage value before a first decrease in the voltage change during the over charging of the reference lithium ion battery; and S124, setting the maximum voltage value of the reference lithium ion battery as the reference voltage value.

In one embodiment, the reference lithium ion battery and the under-test lithium ion battery are over charged by the same electric current (i.e., using the electric current of the same ampere).

Commonly, the lithium ion battery is charged and the voltage of the lithium ion battery increases during the charging. The over charging means that the lithium ion battery is charged to increase the voltage above the charging cut-off voltage of the lithium ion battery. The over charging is charging the lithium ion battery after the voltage is larger than the charging cut-off voltage. The charging cutoff voltage is the voltage when the reversible redox reaction of the cathode active material during charging is completely processed, and above which the structure of the cathode active material may be destroyed. At the charging cutoff voltage, the lithium ion battery is considered fully charged. The charging cutoff voltage depends on the material of the cathode active material. Different cathode active materials may have different charging cutoff voltages. For example, when the anode electrode is lithium metal, the charging cutoff voltage of the $LiFePO_4$ lithium ion battery is about 4.2 V, the charging cutoff voltage of $LiCoO_2$ lithium ion battery is about 4.3 V, and the charging cutoff voltage of $LiMn_2O_4$ lithium ion battery is about 4.4 V.

In step S13, the under-test lithium ion battery is charged to a voltage greater than a charging cutoff voltage of the under-test lithium ion batter. The voltage of the under-test lithium ion battery changes during the over charging, and the voltage change of the under-test lithium ion battery is measured. The under-test lithium ion battery can be galvanostatically charged or charged with increased current during the over charging step. The voltage of the under-test lithium ion battery during the over-charging is maintained above a charging cutoff voltage of the under-test lithium ion battery. In one embodiment, during the over charging, the voltage of the under-test lithium ion battery increases from the charging cutoff voltage and is larger than the charging cutoff voltage.

During the over charging, the voltage of the lithium ion battery has an increasing tendency until the internal short circuit occurs accompanying with the thermal runaway. However, the voltage of the lithium ion battery may not always increase. There may be a voltage decrease occurred in a period of time during the over charging step until the internal short circuit occurs. In step S14, a first voltage decrease during the over charging is found, and the maximum voltage value before the first voltage decrease of the under-test lithium ion battery is recorded, though as the over charging goes on, the voltage of the under-test lithium ion battery may further increase and exceed the maximum voltage value. This maximum voltage value can be used to reflect the over charging endurance ability of the cathode electrode of the under-test lithium ion battery. The higher the maximum voltage value before the first voltage decrease during the over charging, the better the over charging endurance ability of the cathode electrode, and the better the safety of the lithium ion battery.

It is to be understood that, the maximum voltage value does not refer to the largest voltage value during the entire over charging process until the internal short circuit and thermal runaway occur. The maximum voltage value is only the largest voltage value before the first voltage decrease occurs during the over charging.

In step S15, the maximum voltage value of the under-test lithium ion battery is compared with the reference voltage value to evaluate the safety of the under-test lithium ion battery, which is a relative safety to the reference lithium in battery. The safety mainly refers to the safety of the lithium ion battery during the over charging.

One embodiment of a method for evaluating a safety of a lithium ion battery includes steps of:

S21, providing an under-test lithium ion battery including a cathode active material;

S22, setting a reference voltage value according to the cathode active material;

S23, over charging the under-test lithium ion battery, while testing a voltage change of the under-test lithium ion battery during the over charging;

S24, recording a maximum voltage value before a first decrease in the voltage change of the under-test lithium ion battery during the over charging; and S25, evaluating safety factors of the lithium ion battery by comparing the maximum voltage value with the reference voltage value.

In step S25, the lithium ion battery is ranked with a higher safety score if the maximum voltage value before the first voltage decrease during the over charging of the lithium ion battery is higher. The higher the maximum voltage value before the first voltage decrease during the over charging, the better the over charging endurance ability of the cathode electrode, and the better the safety of the lithium ion battery.

EXAMPLE

Example 1

The reference lithium ion battery and the under-test lithium ion battery both use lithium metal as the anode electrode and $LiCoO_2$ as the cathode active material. In the reference lithium ion battery, the $LiCoO_2$ particles are not coated with any coating layer. In the under-test lithium ion battery, the $LiCoO_2$ particles are coated by a continuous $AlPO_4$ layer. All the other conditions (e.g., size, structural design, and other components) of the reference lithium ion battery and the under-test lithium ion are the same, except the coating difference of the $LiCoO_2$ particles, to mostly insure that the temperature results are not affected by the other conditions. The reference lithium ion battery and the under-test lithium ion battery are disposed in an adiabatic box which can provide an approximately adiabatic atmosphere therein.

Figure 1:
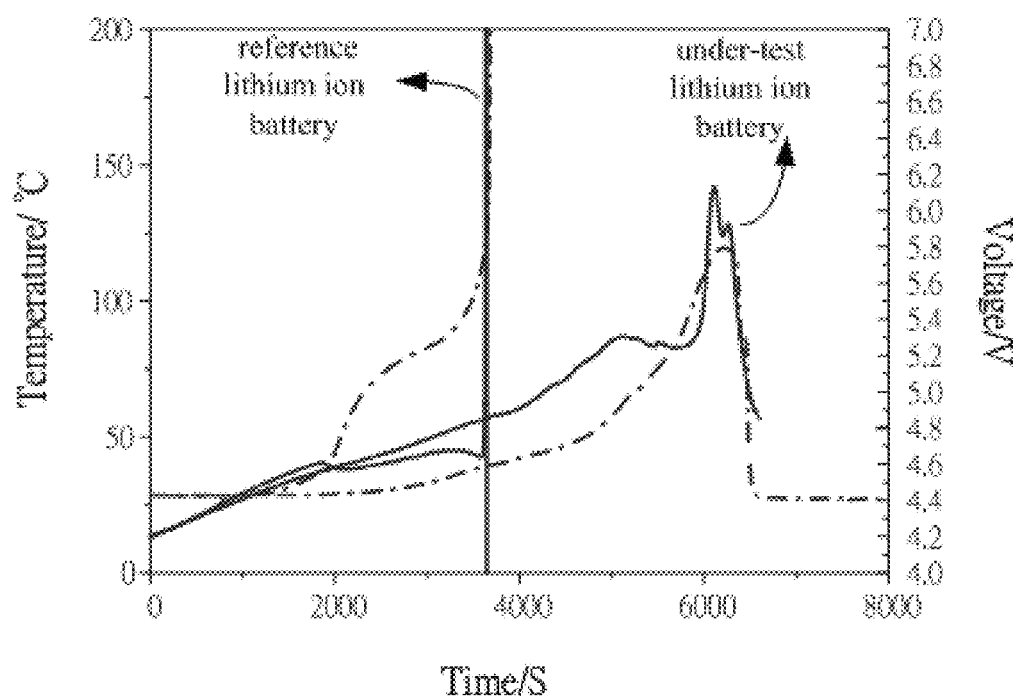
FIG. 1 shows voltage-time and temperature-time curves of an under-test lithium ion battery and a reference lithium ion battery of Example 1.

Referring to FIG. 1, the reference lithium ion battery and the under-test lithium ion battery are galvanostatically charged respectively using the same constant current. The temperatures of the same locations on the outside surfaces of the battery shells of the two batteries are measured. In FIG. 1, the dash-and-dot lines are temperature curves of the two batteries, and the solid lines are voltage curves of the two batteries. It can be seen from the FIG. 1 that accompanying with the charging, the voltages of the two batteries both exceed the charging cut-off voltage (i.e., 4.3V) to be over charged.

The reference lithium ion battery reaches the first maximum voltage value (about 4.6 V) at about the $2000^{th}$ seconds, and has a slight voltage decrease. However, as the charging continuous, the voltage of the reference lithium ion battery continuously increases and suddenly increases rapidly above 7 V at about the $3700^{th}$ seconds. However, the corresponded temperature curve of the reference lithium ion battery does not show any obvious change or thermal runaway at about the $2000^{th}$ seconds when the first maximum voltage value occurs. At this time, the temperature of the reference lithium ion battery is still below 50° C., and is still an acceptable temperature for normal working of the battery. However, as the charging continuous, the thermal runaway appears at about the $3700^{th}$ seconds. The temperature of the lithium ion battery suddenly increases beyond 200° C. and exceeds the range of the graph (the actual temperature at this time is above 500° C.).

The under-test lithium ion battery has similar temperature and voltage changes as the reference lithium ion battery. However, the under-test lithium ion battery reaches the first maximum voltage value (about 5.3 V) at about the $5000^{th}$ seconds. The first maximum voltage value of the under-test lithium ion battery appears much later and is higher than the maximum voltage value of the reference lithium ion battery. Therefore, the under-test lithium ion battery can be evaluated as having better safety than the reference lithium ion battery. The following test confirms this evaluation. Though the temperature of the under-test lithium ion battery exceeds 50° C. at the time when the first maximum voltage value appears, as the charging continues, the under-test lithium ion battery does not eventually have a thermal runaway. After charging (and overcharging) for 6000 seconds, the temperature of the under-test lithium ion battery reaches the maximum value, about 120° C., which is a relatively low temperature.

The above test results show that though the voltage and the temperature of the battery at the time when thermal runaway occurs have a relatively good corresponding relationship, the temperature before the thermal runaway occurs cannot truly reveal the safety of the lithium ion battery. The first maximum voltage value during the over charging can more accurately reveal the over charging endurance ability of the cathode electrode and the safety of the lithium ion battery.

Further, to show the effect from the surrounding circumstance on the temperature of the lithium ion battery, the same reference lithium ion battery is over charged in a heat dissipation circumstance and compared with the reference lithium ion battery which is over charged in the adiabatic box having the approximately adiabatic atmosphere therein.

Figure 2:
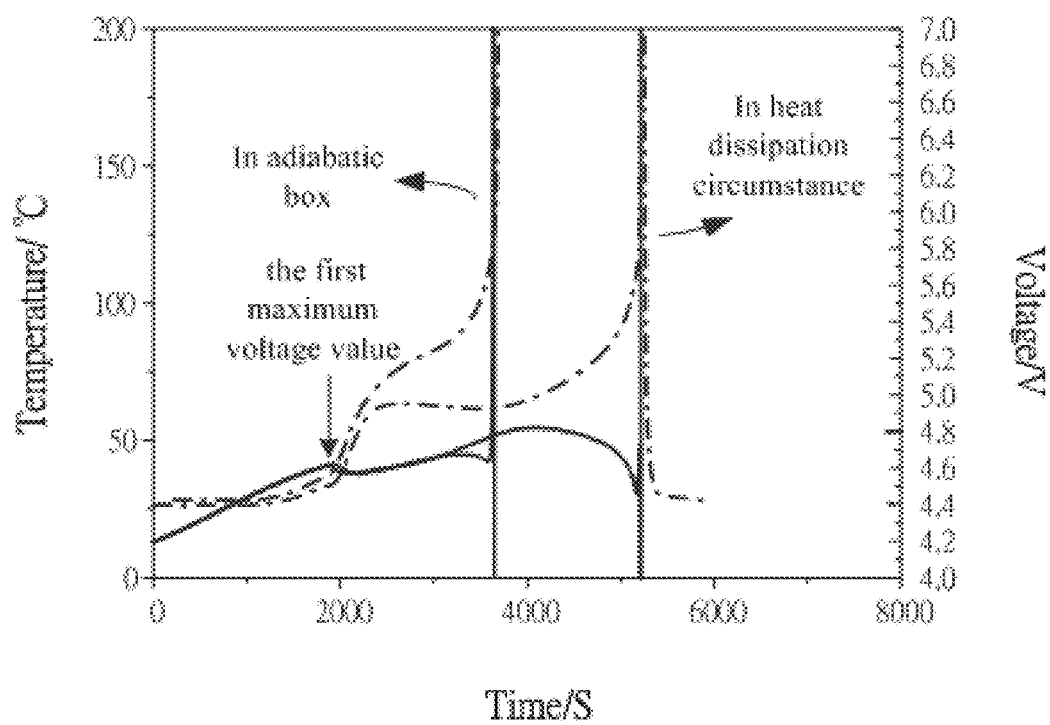
FIG. 2 shows voltage-time and temperature-time curves of the reference lithium ion battery respectively in adiabatic box and in a heat dissipation circumstance.

Referring to FIG. 2, which shows the temperature curves and the voltage curves of the same reference lithium ion battery respectively in the adiabatic box and the heat dissipation circumstance. The dash-and-dot lines are temperature curves. The solid lines are voltage curves. It can be seen from the FIG. 2 that the same lithium ion battery shows different temperature curves at different circumstances. The thermal runaway of the reference lithium ion battery occurs earlier (at about the $3700^{th}$ second) in the adiabatic box than in the heat dissipation circumstance, which occurs at about the $5200^{th}$ second. However, from the charging voltage curves, it can be seen that the two different circumstances do not obviously affect the occurring time (both at about the $2000^{th}$ second) and value (both are about 4.6 V) of the first maximum voltage value. Therefore, the first maximum voltage value of the lithium ion battery does not affected by the outer circumstance and can accurately reveals the over charging endurance ability of the cathode electrode.

Example 2

The reference lithium ion battery and the under-test lithium ion battery both use lithium metal as the anode electrode and $LiNi_{1/3}CO_{1/3}Mn_{1/3}O_2$ as the cathode active material. In the reference lithium ion battery, the $LiNi_{1/3}CO_{1/3}Mn_{1/3}O_2$ particles are not coated with any coating layer. In the under-test lithium ion battery, the $LiNi_{1/3}CO_{1/3}Mn_{1/3}O_2$ particles are coated by an $AlPO_4$ layer. All the conditions (e.g., size, structural design, and other components) of the reference lithium ion battery and the under-test lithium ion are the same, except the coating difference of the $LiNi_{1/3}Co_{1/3}Mm_{1/3}O_2$ particles. The reference lithium ion battery and the under-test lithium ion battery are disposed in an adiabatic box which can provide an approximately adiabatic atmosphere therein.

Figure 3:
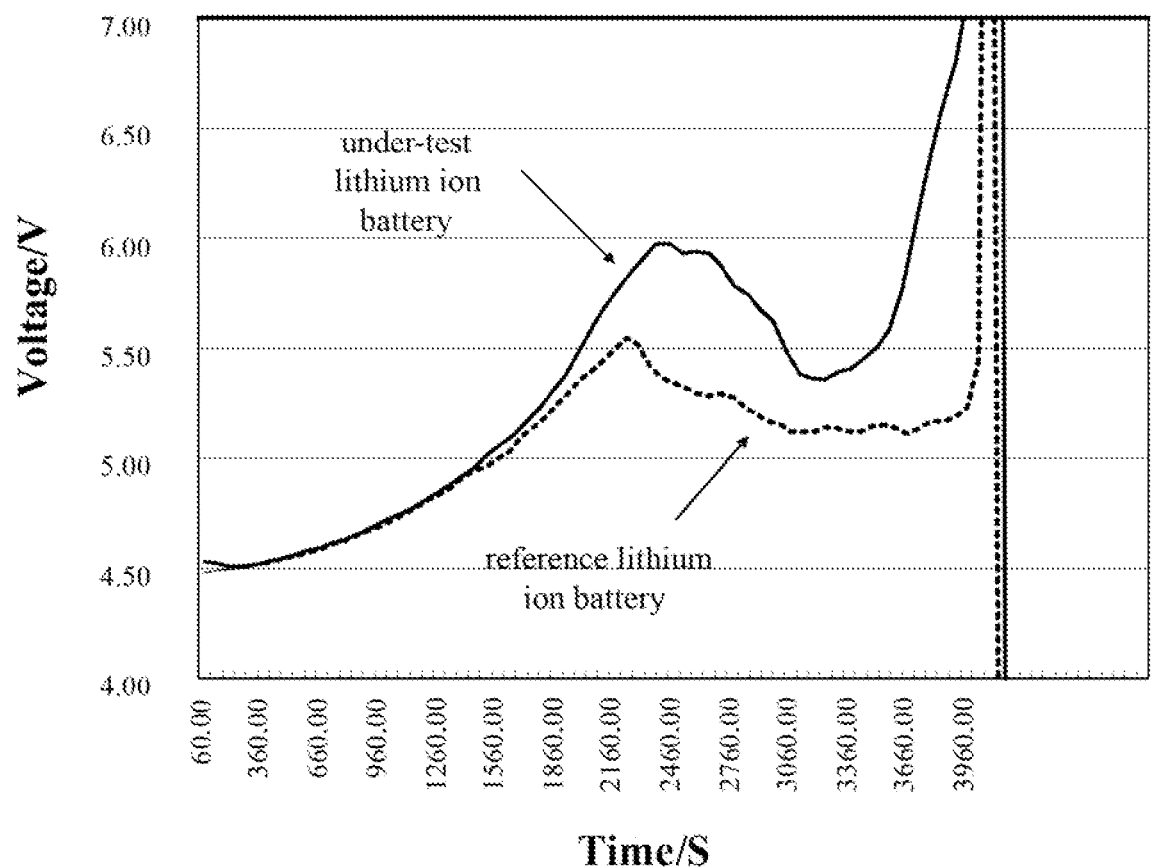
FIG. 3 shows voltage-time curves of the under-test lithium ion battery and the reference lithium ion battery of Example 2.

Referring to FIG. 3, the reference lithium ion battery and the under-test lithium ion battery are galvanostatically charged respectively using the same constant current. The temperatures of the same locations on the outside surfaces of the battery shells of the two batteries are measured. In FIG. 3, the dot line is the voltage curve of the reference lithium ion battery, and the solid line is the voltage curve of the under-test lithium ion battery. It can be seen from the FIG. 3 that accompanying with the charging, the voltages of the two batteries both exceed the charging cut-off voltage (i.e., 4.4 V) to be over charged.

As shown in the FIG. 3, the reference lithium ion battery reaches the first maximum voltage value (about 5.55 V) at about the $2200^{th}$ seconds, and has a voltage decrease. However, as the charging continuous, the voltage of the reference lithium ion battery continuously increases and suddenly increases rapidly above 10.5 V, which exceeds the range of the graph, at about the $4000^{th}$ seconds. However, the reference lithium ion battery does not have an obvious temperature change at about the $2200^{th}$ seconds when the first maximum voltage value occurs. At this time, the temperature of the reference lithium ion battery is still below 20° C., and is still an acceptable temperature for normal working of the battery. However, as the charging continuous, the thermal runaway appears at about the $4000^{th}$ seconds. The temperature curve of the reference lithium ion battery suddenly increases and the reference lithium ion battery starts to burn.

The under-test lithium ion battery has similar temperature and voltage changes as the reference lithium ion battery.

However, the under-test lithium ion battery reaches the first maximum voltage value (about 6 V) at about the 2400$^{th}$ seconds. The first maximum voltage value of the under-test lithium ion battery appears much later and higher than the maximum voltage value of the reference lithium ion battery. Therefore, the under-test lithium ion battery can be evaluated as having better safety than the reference lithium ion battery. The following test confirms this evaluation. Though the temperature of the under-test lithium ion battery exceeds 23° C. at the time when the first maximum voltage value appears, as the charging continuous, the under-test lithium ion battery does not eventually has a thermal runaway. After charging for 4050 seconds, the voltage of the under-test lithium ion battery reaches to about 20 V (which exceeds the range of FIG. 3), and the temperature of the under-test lithium ion battery reaches the maximum value (about 130° C. to 160° C.). However, no burning occurs in the under-test lithium ion battery.

The test and evaluation of the maximum voltage value before the first voltage decrease during the over charging can be used to evaluate the over charging endurance ability and the safety of the lithium ion battery. The higher the maximum voltage value before the first voltage decrease during the over charging, the better the over charging endurance ability of the cathode electrode, and the better the safety of the lithium ion battery. Different from the testing of the temperature, the voltage testing method excludes the affections coming from the measuring location, the battery structural design, the surrounding temperature to the temperature data of the under-test lithium ion battery. Thus, the voltage testing method can accurately evaluate the safety of the lithium ion battery.

Depending on the embodiment, certain steps of the methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

Finally, it is to be understood that the above-described embodiments are intended to illustrate rather than limit the present disclosure. Variations may be made to the embodiments without departing from the spirit of the present disclosure as claimed. Elements associated with any of the above embodiments can be associated with any other embodiments. The above-described embodiments illustrate the scope of the present disclosure but do not restrict the scope of the present disclosure.

What is claimed is:

1. A method for testing a lithium ion battery comprising steps of:
   providing an under-test lithium ion battery comprising a cathode active material;
   setting a reference voltage value according to the cathode active material;
   over charging the under-test lithium ion battery, while testing a voltage change of the under-test lithium ion battery during the over charging, and a first voltage decrease occurs during the over charging before an internal short circuit occurs;
   recording a maximum voltage value before the first voltage decrease in the voltage change during the over charging of the under-test lithium ion battery; and
   comparing the maximum voltage value with the reference voltage value.

2. The method of claim 1, wherein during the over charging, the under-test lithium ion battery is charged to a voltage greater than a charging cutoff voltage of the under-test lithium ion battery.

3. The method of claim 1, wherein the under-test lithium ion battery is galvanostatically charged during the over charging.

4. The method of claim 1, wherein the under-test lithium ion battery is charged with an increased electric current during the over charging.

5. The method of claim 1, wherein the reference voltage value is set by following steps:
   providing a reference lithium ion battery comprising a same cathode active material as the cathode active material of the under-test lithium ion battery;
   over charging the reference lithium ion battery, while testing a voltage change of the reference lithium ion battery during the over charging, and a first voltage decrease occurs during the over charging before an internal short circuit occurs;
   recording a maximum voltage value before the first voltage decrease in the voltage change during the over charging of the reference lithium ion battery; and
   setting the maximum voltage value of the reference lithium ion battery as the reference voltage value.

6. The method of claim 5, wherein the reference lithium ion battery and the under-test lithium ion battery are over charged with an electric current of a same ampere.

7. A method for evaluating a safety of a lithium ion battery comprising steps of:
   providing an under-test lithium ion battery comprising a cathode active material;
   setting a reference voltage value according to the cathode active material;
   over charging the under-test lithium ion battery, while testing a voltage change of the under-test lithium ion battery during the over charging, and a first voltage decrease occurs during the over charging before an internal short circuit occurs;
   recording a maximum voltage value before the first voltage decrease in the voltage change of the under-test lithium ion battery during the over charging; and
   evaluating safety factors of the lithium ion battery by comparing the maximum voltage value with the reference voltage value.

8. The method of claim 7, wherein during the over charging, the under-test lithium ion battery is charged to a voltage greater than a charging cutoff voltage of the under-test lithium ion battery.

9. The method of claim 7, wherein the under-test lithium ion battery is galvanostaticly charged during the over charging.

10. The method of claim 7, wherein the under-test lithium ion battery is charged with an increased electric current during the over charging.

11. The method of claim 7, wherein the reference voltage value is set by following steps:
    providing a reference lithium ion battery comprising a same cathode active material as the cathode active material of the under-test lithium ion battery;
    over charging the reference lithium ion battery, while testing a voltage change of the reference lithium ion battery during the over charging, and a first voltage decrease occurs during the over charging before an internal short circuit occurs;

recording a maximum voltage value before the first voltage decrease in the voltage change during the over charging of the reference lithium ion battery; and setting the maximum voltage value of the reference lithium ion battery as the reference voltage value.

12. The method of claim 11, wherein the reference lithium ion battery and the under-test lithium ion battery are over charged with an electric current of a same ampere.

13. The method of claim 7, wherein the evaluation safety factors of the lithium ion battery comprising ranking the lithium ion battery with a higher safety score if the maximum voltage value before the first voltage decrease during the over charging of the lithium ion battery is higher than that of the reference lithium ion battery.

* * * * *